(12) United States Patent
Deng et al.

(10) Patent No.: US 11,993,465 B2
(45) Date of Patent: May 28, 2024

(54) VACUUM ADSORPTION MODULE

(71) Applicants: Tyco Electronics (Shanghai) Co. Ltd., Shanghai (CN); TE Connectivity Services GmbH, Schaffhausen (CH); Measurement Specialties (Chengdu) Ltd., Chengdu (CN); Kunshan League Automechanism Co., Ltd., Kunshan (CN)

(72) Inventors: Yingcong Deng, Shanghai (CN); Dandan Zhang, Shanghai (CN); Fengchun Xie, Shanghai (CN); Lvhai Hu, Shanghai (CN); Bo Pang, Chengdu (CN); Haidong Wu, Kunshan (CN); Jianyong Fan, Kunshan (CN); Rong Zhang, Shanghai (CN); Roberto Francisco-Yi Lu, Bellevue, WA (US)

(73) Assignees: Kunshan League Automechanism Co., Ltd., Kunshan (CN); TE Connectivity Solutions GmbH, Schaffhausen (CH); Measurement Specialties (Chengdu) Ltd., Chengdu (CN); Tyco Electronics (Shanghai) Co., Ltd., Shanghai (CN)

( * ) Notice: Subject to any disclaimer, the term of this patent is extended or adjusted under 35 U.S.C. 154(b) by 812 days.

(21) Appl. No.: 17/097,361

(22) Filed: Nov. 13, 2020

(65) Prior Publication Data
US 2021/0147161 A1    May 20, 2021

(30) Foreign Application Priority Data
Nov. 15, 2019    (CN) .......................... 201921971358.3

(51) Int. Cl.
| | | |
|---|---|---|
| *B65G 47/91* | (2006.01) | |
| *B25J 15/06* | (2006.01) | |
| *H05K 13/00* | (2006.01) | |

(52) U.S. Cl.
CPC ........ *B65G 47/917* (2013.01); *B25J 15/0625* (2013.01); *H05K 13/0069* (2013.01)

(58) Field of Classification Search
CPC ............... B25J 15/0625; B25J 15/0633; B25J 15/0641; B66C 1/0237; B66C 1/025; B66C 1/0281; B65G 47/91; B65G 47/917
See application file for complete search history.

(56) References Cited

U.S. PATENT DOCUMENTS 2,572,640 A * 10/1951 Lovegrove ............. G03B 27/60
269/21
3,408,031 A * 10/1968 Muir, Jr. ................ B65G 47/91
353/65

(Continued)

*Primary Examiner* — Dean J Kramer
(74) *Attorney, Agent, or Firm* — Barley Snyder

(57) ABSTRACT

A vacuum adsorption module includes a supporting block, a carrier installed and positioned on the supporting block, and a plurality of valves installed on the supporting block. The supporting block has a plurality of air connection holes, each row of air connection holes is connected to a total air path formed in the supporting block via a branch air path formed in the supporting block. The carrier has a plurality of air suction holes corresponding to the air connection holes. The valves control closing and opening of the branch air paths between the plurality of rows of air connection holes and the total air path. An adsorption length of the carrier in a column direction of the array is adjustable to match a length of an article to be adsorbed by the carrier by changing a number of the valves to be closed or opened.

11 Claims, 2 Drawing Sheets

(56) References Cited

U.S. PATENT DOCUMENTS

| | | | | |
|---|---|---|---|---|
| 3,910,621 A | * | 10/1975 | Hillier | B66C 1/0281 |
| | | | | 269/21 |
| 5,125,706 A | * | 6/1992 | Kuwaki | B25J 15/0616 |
| | | | | 294/907 |
| 5,609,377 A | * | 3/1997 | Tanaka | B65G 47/918 |
| | | | | 901/46 |
| 7,296,834 B2 | * | 11/2007 | Clark | B25J 15/0616 |
| | | | | 294/65 |
| 7,938,466 B2 | * | 5/2011 | Joguet | B65G 47/91 |
| | | | | 294/189 |
| 8,146,972 B2 | * | 4/2012 | Petijean | B65B 43/305 |
| | | | | 414/737 |
| 9,205,558 B1 | * | 12/2015 | Zevenbergen | B25J 15/0052 |
| 9,604,367 B2 | * | 3/2017 | Harter | B65G 47/91 |

\* cited by examiner

VACUUM ADSORPTION MODULE

CROSS-REFERENCE TO RELATED APPLICATION

This application claims the benefit of the filing date under 35 U.S.C. § 119(a)-(d) of Chinese Patent Application No. 201921971358.3, filed on Nov. 15, 2019.

FIELD OF THE INVENTION

The present disclosure relates to an adsorption module and, more particularly, to a vacuum adsorption module adapted to adsorb an article.

BACKGROUND

In the field of electronic or mechanical manufacturing, it is often necessary to use a vacuum adsorption module to adsorb an article, such as an electronic device or a workpiece. In the prior art, the vacuum adsorption module usually comprises a number of vacuum air suction holes. During adsorption, all vacuum air suction holes adsorb the article at the same time, and an adsorption length of the vacuum adsorption module is constant and cannot be adjusted according to the length of the article to be adsorbed. Thereby, the vacuum adsorption module can only be used to adsorb the articles with a predetermined length, and cannot adsorb articles with different lengths.

SUMMARY

A vacuum adsorption module includes a supporting block, a carrier installed and positioned on the supporting block, and a plurality of valves installed on the supporting block. The supporting block has a plurality of air connection holes, each row of air connection holes is connected to a total air path formed in the supporting block via a branch air path formed in the supporting block. The carrier has a plurality of air suction holes corresponding to the air connection holes. The valves control closing and opening of the branch air paths between the plurality of rows of air connection holes and the total air path. An adsorption length of the carrier in a column direction of the array is adjustable to match a length of an article to be adsorbed by the carrier by changing a number of the valves to be closed or opened.

BRIEF DESCRIPTION OF THE DRAWINGS

The invention will now be described by way of example with reference to the accompanying Figures, of which.

DETAILED DESCRIPTION OF THE EMBODIMENTS

Figure 1:
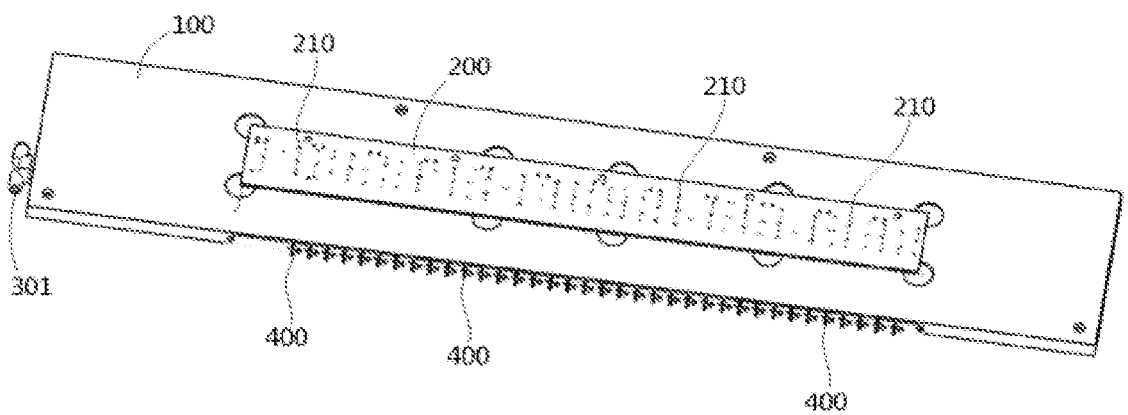
FIG. 1 is a perspective view of a vacuum adsorption module according to an embodiment.

The technical scheme of the disclosure is further described in detail by the following embodiments with reference to the accompanying drawings. In the specification, the same or similar reference numerals denote the same or similar components. The following description of the embodiments of the present disclosure with reference to the accompanying drawings is intended to explain the general inventive concept of the disclosure and should not be construed as a limitation of the present disclosure.

In addition, in the following detailed description, for purposes of explanation, numerous specific details are set forth in order to provide a thorough understanding of the embodiments of the disclosure. However, it may be evident, that one or more embodiments may be practiced without these specific details. In other instances, well-known structures and devices are shown in schematic form in order to simplify the drawing.

Figure 2:
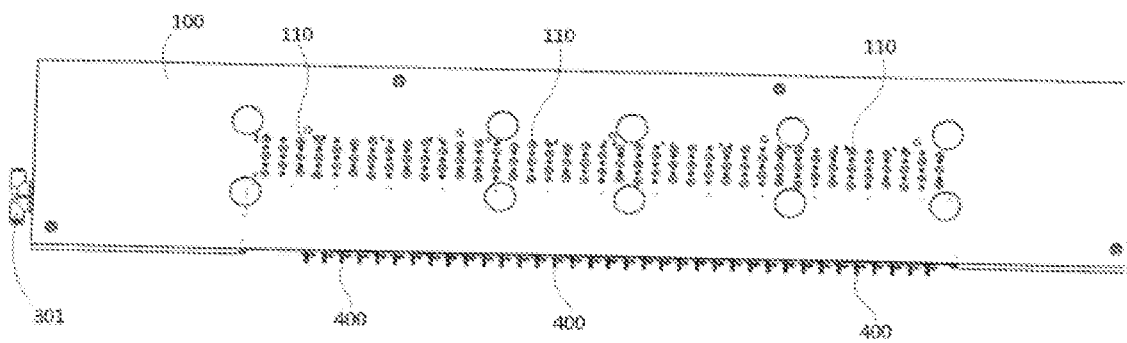
FIG. 2 is a perspective view of a supporting block of the vacuum adsorption module.
Figure 3:
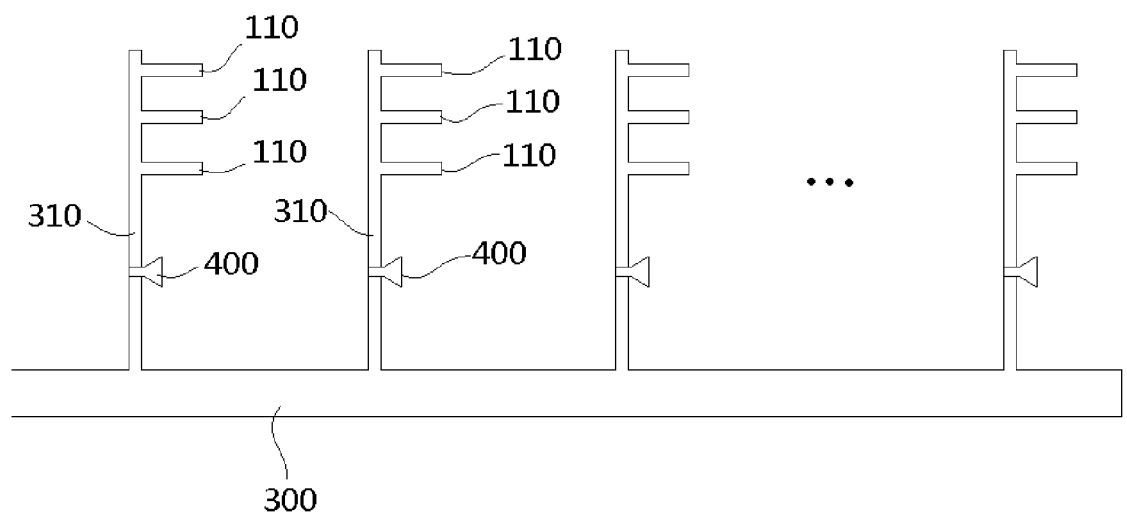
FIG. 3 is a schematic diagram of a plurality of air paths in the supporting block.

A vacuum adsorption module according to an embodiment, as shown in FIGS. 1-3, comprises a supporting block 100, a carrier (also referred to as a sucker) 200, and a plurality of valves 400.

The supporting block 100, as shown in FIGS. 1-3, is formed with a plurality of rows and columns of air connection holes 110 distributed in an array. Each row of air connection holes 110 is connected to a total air path 300 formed in the supporting block 100 via a separate branch air path 310 formed in the supporting block 100.

In the illustrated embodiment, as shown in FIGS. 1-3, the carrier 200 is adapted to be installed and positioned on the supporting block 100. The carrier 200 is formed with a plurality of rows and columns of air suction holes 210 corresponding to the air connection holes 110 in the supporting block 100, respectively, and distributed in an array. Each air suction hole 210 extends through the carrier 200 in a thickness direction of the carrier 200. In an embodiment, a column direction of the air suction holes 210 in the carrier 200 is defined as a length direction of the carrier 200, and a row direction of the air suction holes 210 in the carrier 200 is defined as a width direction of the carrier 200.

In the illustrated embodiment, as shown in FIGS. 1-3, the plurality of valves 400 are installed on the supporting block 100. Each valve 400 is connected to the corresponding branch air path 310 for controlling closing and opening of the branch air path 310 between the corresponding row of air connection holes 110 and the total air path 300. In an embodiment, the valve 400 may be a manual switch valve connected to the branch air path 310. In an embodiment, the valve 400 may be a solenoid valve connected to the branch air path 310.

In the illustrated embodiment, as shown in FIGS. 1-3, the total air path 300 in the supporting block 100 is adapted to be connected to a vacuum pump (not shown, the vacuum pump is used to provide a vacuum adsorption force). The air suction holes 210 in the carrier 200 are adapted to be docked with the air connection holes 110 in the supporting block 100 respectively, so that air communication between each row of air suction holes 210 in the carrier 200 and the vacuum pump may be connected or disconnected by opening or closing the corresponding valve 400. In this way, by changing the number of the valves 400 to be closed or opened, an adsorption length of the carrier 200 in a column direction of the array of the air suction holes 210 is capable of being adjusted to match a length of an article to be adsorbed by the carrier 200. For example, if all the valves 400 are opened, the adsorption length of the carrier 200 will reach the maximum; if some of the valves 400 are closed (for example, the first and second vales 400 are closed), the adsorption length of the carrier 200 will become less than the maximum. Thereby, the vacuum adsorption module of the present application may be used to adsorb articles with different lengths.

In an embodiment, the vacuum adsorption module further comprises a controller for controlling closing and opening of the solenoid valves 400. The controller may control the number of the solenoid valves 400 to be closed or opened according to the length of the adsorbed article, so that the adsorption length of the carrier matches the length of the adsorbed article.

In another exemplary embodiment of the present disclosure, as shown in FIGS. 1-3, because the air communication between each row of air suction holes 210 in the carrier 200 and the vacuum pump may be connected or disconnected by opening or closing the corresponding valve 400, the distribution uniformity of the adsorption force of the carrier 200 may be changed by selectively closing or opening some of the valves 400. In this way, the distribution uniformity of the adsorption force of the carrier 200 may be adjusted to be compatible with the flexibility of the adsorbed article. For example, if the adsorbed article is very flexible, all valves 400 should be opened to make the distribution of the adsorption force of the carrier 200 more uniform and reduce the deformation of the adsorbed flexible article. If the adsorbed article is rigid, some of valves 400 (for example, the odd-numbered valves 400 or the even-numbered valves 400) may be closed to decrease the distribution uniformity of the adsorption force of the carrier 200.

In the illustrated embodiment, as shown in FIGS. 1-3, each air suction hole 210 in the carrier 200 has an inlet on a top surface of the carrier 200 and an outlet on a bottom surface of the carrier 200. Each air connection hole 110 in the supporting block 100 has a connecting port on the top surface of the supporting block 100, the connecting port is adapted to be hermetically docked with the outlet of the air suction hole 210. For example, the connecting port of the air connection hole 110 may be hermetically embedded in the outlet of the air suction hole 210. In order to ensure the air sealing performance, an elastic sealing ring may be provided on the connecting port of the air connection hole 110 and/or the outlet of the air suction hole 210.

In the illustrated embodiment, as shown in FIGS. 1-3, one of the supporting block 100 and the carrier 200 is formed with a plurality of positioning holes (not shown), and the other of the supporting block 100 and the carrier 200 is formed with a plurality of positioning pins (not shown). The positioning pins are engaged with the positioning holes, respectively, to position the carrier 200 on the top surface of the supporting block 100.

In the illustrated embodiment, as shown in FIGS. 1 and 2, a pipe joint 301 is provided on the supporting block 100, and the pipe joint 301 is connected to the outlet of the total air path 300 so that the total air path 300 may be connected to the vacuum pump by the pipe joint 301.

Those skilled in the art will appreciate that the above-described embodiments are illustrative and can be modified by those skilled in the art, and that the structures described in the various embodiments can be freely combined without conflict in structure or principle. Although the present disclosure has been described with reference to the accompanying drawings, the embodiments disclosed in the drawings are intended to be illustrative explanations of the embodiments of the disclosure, and should not be construed as limiting the disclosure.

Although a few embodiments of the present general inventive concept have been shown and described, it would be appreciated by those skilled in the art that changes may be made in these embodiments without departing from the principles and spirit of the present general inventive concept, and the scope of the present disclosure is defined by the claims and their equivalents.

What is claimed is:

1. A vacuum adsorption module, comprising:
    a supporting block having a plurality of rows and columns of air connection holes distributed in an array, each row of air connection holes being connected to a total air path formed in the supporting block via a branch air path formed in the supporting block, the total air path in the supporting block is adapted to be connected to a vacuum pump;
    a carrier installed and positioned on the supporting block, the carrier having a plurality of rows and columns of air suction holes corresponding to the air connection holes in the supporting block, respectively, and distributed in an array, the air suction holes in the carrier are adapted to be docked with the air connection holes in the supporting block; and
    a plurality of valves installed on the supporting block, the plurality of valves being used to control closing and opening of the branch air paths between the plurality of rows of air connection holes and the total air path, each valve controls connection and disconnection of an air communication between one of the rows of air suction holes in the carrier and the vacuum pump, an adsorption length of the carrier in a column direction of the array is adjustable to match a length of an article to be adsorbed by the carrier by changing a number of the valves to be closed or opened.

2. The vacuum adsorption module of claim 1, wherein each air suction hole in the carrier has an inlet on a top surface of the carrier and an outlet on a bottom surface of the carrier.

3. The vacuum adsorption module of claim 2, wherein each air connection hole in the supporting block has a connecting port on a top surface of the supporting block, the connecting port is adapted to be hermetically docked with the outlet of the air suction hole.

4. The vacuum adsorption module of claim 3, wherein an elastic sealing ring is provided on at least one of the connecting port of the air connection hole and the outlet of the air suction hole.

5. The vacuum adsorption module of claim 1, wherein a plurality of positioning holes are formed in one of the supporting block and the carrier, and a plurality of positioning pins are formed on the other of the supporting block and the carrier, the positioning pins engage the positioning holes to position the carrier on the top surface of the supporting block.

6. The vacuum adsorption module of claim 1, wherein the supporting block has a pipe joint connected to an outlet of the total air path, the total air path is connected to the vacuum pump by the pipe joint.

7. The vacuum adsorption module of claim 1, wherein a column direction of the air suction holes in the carrier arranged in the array is defined as a length direction of the carrier, and a row direction of the air suction holes in the carrier is defined as a width direction of the carrier.

8. The vacuum adsorption module of claim 1, wherein each of the valves is a manual switch valve connected to the branch air path.

9. The vacuum adsorption module of claim 1, wherein each of the valves is a solenoid valve connected to the branch air path.

10. The vacuum adsorption module of claim 9, further comprising a controller for controlling closing and opening the solenoid valve.

11. The vacuum adsorption module of claim 10, wherein the controller is configured to control a number of solenoid valves to be closed or opened according to the length of the article to be adsorbed by the carrier, so that the adsorption length of the carrier matches the length of the article.

\* \* \* \* \*